United States Patent [19]

Crouse

[11] 4,110,705
[45] Aug. 29, 1978

[54] NOISE REDUCTION METHOD AND APPARATUS FOR COMPANDED DELTA MODULATORS

[75] Inventor: William George Crouse, Raleigh, N.C.

[73] Assignee: International Business Machines Corporation, Armonk, N.Y.

[21] Appl. No.: 842,710

[22] Filed: Oct. 17, 1977

[51] Int. Cl.² .............................................. H03K 7/02
[52] U.S. Cl. ................................. 332/11 D; 325/38 B
[58] Field of Search ................... 332/11 D, 9 R, 9 T, 332/18; 325/38 B

[56] References Cited

U.S. PATENT DOCUMENTS

| | | | |
|---|---|---|---|
| 3,716,803 | 2/1973 | Candy | 332/11 D |
| 3,806,806 | 4/1974 | Brolin | 332/11 D |
| 3,995,218 | 11/1976 | Moriya | 332/11 D |
| 4,025,852 | 5/1977 | Ching | 331/11 D |

OTHER PUBLICATIONS

IBM Tech. Discl. Bull. "Delta coder," H. R. Schindler, vol. 13, No. 8, Jan. 1971.
IBM Tech. Discl. Bull. "Step Gen. for Delta Mod.," V. Appel, vol. 16, No. 11, Apr. 1974.

*Primary Examiner*—John Kominski
*Attorney, Agent, or Firm*—Edward H. Duffield

[57] ABSTRACT

A noise reduction circuit and method are described for implementation in a delta modulation system for signal transmission. Under certain conditions when the delta modulator has selected the minimum step size for encoding and transmission, the present technique and apparatus are effective to change the minimum step size in a way which prevents low level noise generation from occurring in the delta modulation system. The technique and circuit can be utilized with most commonly available delta modulators which have means for changing the step size (i.e., the delta) but is used to the best effect on more stable implementations of delta modulators where an integrator is replaced by a digital accumulator and a digital-to-analog converter.

2 Claims, 4 Drawing Figures

NOISE REDUCTION METHOD AND APPARATUS FOR COMPANDED DELTA MODULATORS

FIELD OF THE INVENTION

This invention relates to modulated signal transmission means of the digital type in general and more specifically to analog-to-digital converters and circuits and to delta modulation and demodulation systems in particular.

PRIOR ART

Modulation systems which comprise components for monitoring an analog signal, generating a digital pulse or number of pulses as an encoded digital representation for the analog amplitude at a given sample time, transmission means, a receiver and digital-to-analog converters for reconstructing an analog waveform as a close approximation to the original analog signal which was being monitored, are generally well-known in the art.

As is well known in the prior art, delta modulation is a means commonly used to convert speech or other similar analog signals into a serial digital bit stream which can easily be converted back to an analog form. Normally, a delta modulator system generates analog voltages in an integrator or accumulator coupled to a digital-to-analog converter. The analog voltage represents an approximation of the original input analog signal. For purposes of discussion, the value or level of the voltage generated in an accumulator may be called the accumulator value. This value is normally compared with the input analog signal through a voltage comparison circuit at a regular sample interval. Sample intervals are spaced close together to provide a smooth approximation to the analog signal input. A typical sampling frequency may be 32,000 samples per second. A single data bit is generated at the output bit stream for each sample. Under a standard type of system, the bit will have a value of 1 if the voltage comparator indicates that the analog signal is more positive than the accumulator value, and the output bit will be 0 if the opposite situation is true. The value of the digital bits so generated is utilized for controlling the addition or subtraction of an increment in the accumulator. The increment is commonly refered to as the "step size" or "delta" in delta modulation systems. For each sample time then, the accumulator value will be incremented or decremented by an amount such that the accumulator value will follow in an approximate way the analog voltage. In this manner, the accumulator value may be maintained at a level within approximately one step size or delta of that level which is instantaneously occurring at the signal voltage input.

A problem with such delta modulation is that rapidly changing input voltages, such as those produced as high frequencies and/or large amplitudes, require a large step size in the accumulator to maintain adequate tracking between the accumulator value and the instantaneous analog signal input. Slowly changing signals, on the other hand, require smaller step sizes. However, if the step size is made too small, the accumulator will not be able to track the analog input signal. Conversely, if the step size is too large, there will be an excessive error or overshoot in the accumulator value due to the lack of resolution. This problem has been addressed in recent years by a technique generally referred to as "companding". This technique is unlike conventional companders which have a logarithmic forward voltage transfer based on an instantaneous input voltage. The technique is more like an automatic gain control in that the "step size" is calculated based upon the history of the previous input signal. There are a variety of algorithms for performing the function, most of them calculate the step size ranging from some minimum on up to 30 or 100 times the minimum. This yields a 30 or 40 db dynamic range. The specific algorithm is a matter of choice and is not pertinent to the present invention other than for its general teaching as the commonly used delta modulation technique.

Demodulation of a transmitted digital bit stream representative of the comparisons between the accumulator value and the input sample is generally accomplished with a device identical to the modulator but without the comparison function. The demodulator as it is called, calculates the step size utilizing the same algorithm that the modulator utilized in determining its step size. When the step size is calculated, it is simply added to or subtracted from another accumulator value as dictated by the bit received at each sample time. This accumulator value is then converted to an analog signal through a digital to analog converter and the result closely approximates the original analog signal waveform input at the delta modulator. The details of the digital transmission and reception are well known to those of skill in the art and do not form a part of this invention. Likewise, the specific details of a delta modulator or demodulator insofar as the digital to analog converters, accumulators or integrators and step size generation algorithms and means are concerned do not form a part of the present invention.

As is apparent to those of skill in the art, there exist many problems in the practical implementation of delta modulator systems. One of these is that such systems inherently create a noisy condition during quiet passages of analog input. This is most apparent when the analog input is a voice signal intended for digitization, transmission and reconstruction. During quiet periods of a voice input signal, the emphasis of noise may be exaggerated and become very disturbing to a human listener. Exaggeration of the noise occurs because of the fact that it is difficult to maintain a good signal to noise ratio when there is very little input signal.

Due to its digital nature, a delta modulation system must send 1's and 0's and the very smallest output signal that it can produce is that which will be generated by an alternate stream of digital 1's and 0's. This 1 and 0 output pattern results in an accumulator value which alternates plus and minus one step size about some 0 level. If this is achieved, the result is a square wave at a frequency equal to one-half of the sampling frequency. For example, 16K hertz for a 32K hertz sample. Such a frequency may easily be filtered from the analog or speach output which is usually limited to less than a few kilohertz.

If the alternate 1, 0 pattern which the delta modulator sends during a quiet period is broken, such as by a noise burst in the transmission system, then lower (in band) frequencies, i.e., below the several kilohertz filter limitation, are easily the result and such signals reproduce themselves as noise in the output.

The increased stability for digital implementations inherent in LSI circuitry has reduced many of the causes which would break the quiet 1, 0 pattern in the digital transmission system, but another cause still remains. It is most desirable to have the step size at its minimum level as small as can be effectively handled in order to recreate very small signals. The minimum step size unfortunately often compares with that experienced as an offset voltage between the comparators and amplifiers, even when low offsets are achieved by maintaining common substrate voltages as utilized in LSI technology today. Due to the multiple components in LSI circuitry, the offset voltages may accumulate to the point where the quiet signal analog level will approach or surpass a given step level for the accumulator and the quiet 1, 0 bit pattern will be broken. The result will be a relatively random noise, the amplitude of which will be determined by the minimum step size and by how closely the input signal aligns with a given step level in the comparator.

This problem is inherent in the very nature and design of digital circuits utilizing the delta modulation principle.

OBJECTS OF THE INVENTION

In light of the foregoing difficulties inherent in the prior art delta modulation systems, it is an object of this invention to provide an improved low level noise reduction circuit and technique which eliminates or reduces much of the low signal level random noise generation problem.

Another object of this invention is to provide an improved method or technique for low level noise reduction in delta modulation data transmission systems.

SUMMARY

The present invention addresses and eliminates most of the random low level noise generation by modifying the step size generation algorithm utilized in the delta modulation scheme according to the following criteria. The step size which will be supplied to the accumulator will be forced to be twice the minimum step size that the algorithm can generate when and if the actual calculated step size is the minimum and the newest sample delta modulation bit is not the same as the previous delta modulation bit. The result of this modification is that the step size automatically adjusts so as to straddle the signal level in the output. If the signal level drifts from this position, the modified step size algorithm allows the selected steps to shift so as to once more straddle the signal level and restore the quiet 1 and 0 output pattern. The demodulation algorithm can be left unchanged or can be modified to be identical with the modulator without creating major differences in performance.

BRIEF DESCRIPTION OF THE DRAWINGS

The foregoing and still other objects not mentioned for the present invention are met in a preferred embodiment of the invention which will be described now with reference to the drawings in which:

Turning to FIG. 1, a typical digitally implemented delta modulator having the noise reduction circuit of the present invention added to it is illustrated.

In FIG. 1, the analog voltage input signal from a microphone or other voice input for example, is applied to the voltage comparator 1. The output of the voltage comparator 1 is applied to the sample value latch 3 which fixes the value of the sample instantaneously under the control of the sample clock input 2. The clock is not shown, but would comprise a 32K hertz oscillator, for example, the details of which are well known to those of skill in the art. A digital accumulator 6 and a digital to analog converter 5 are joined together to replace a more conventional integrator for the delta modulator. The output of the digital to analog converter 5 is applied to the voltage comparator 1. Thus, the output of the voltage comparator 1 will show the polarity of the difference between the analog input signal and the present value of the digital to analog converter 5, and this will be the sample stored in sample latch 3 under the control of clock 2. A step size generator 8 operating on an internal algorithm for generating companded step sizes in accordance with the previous history of the signal input samples calculates a given desired step size for each sample. The step size is added or subtracted from the accumulator value in the accumulator 6. However, in the present embodiment, the noise reduction circuit is inserted between step size generator 8 and the digital accumulator 6.

Figure 1:
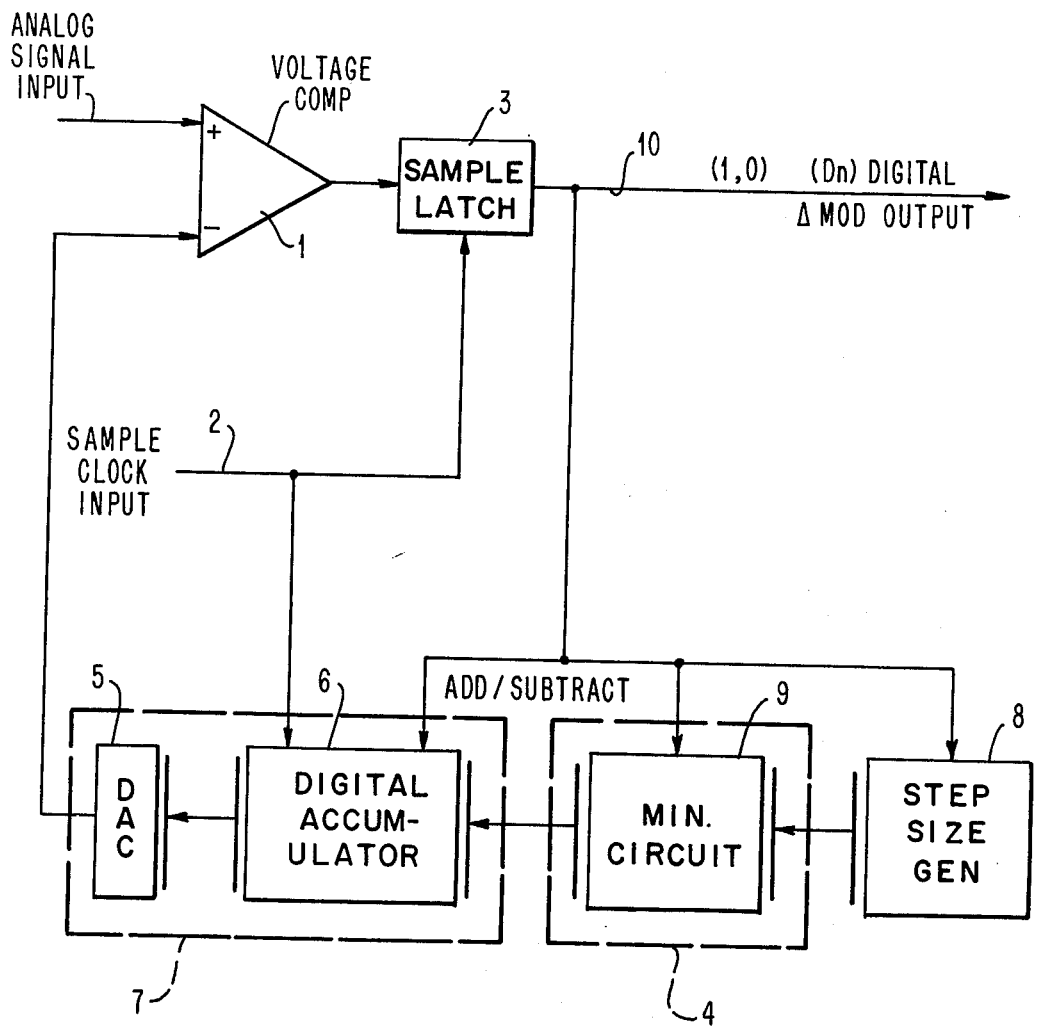
FIG. 1 illustrates in block form the major components of a companding delta modulator having a noise reduction circuit of the present invention included in it.

The minimum circuit or noise reduction circuit 9 is shown within the dotted block 4 in FIG. 1. The calculated step size according to the algorithm contained in the step size generator 8 is forced to pass through this minimum circuit 9 for possible modification according to the method of the present invention.

The output of the sample latch 3 controls the accumulator add and subtract function in accumulator 6 so that, if the voltage comparator 1 shows that the output from the digital to analog converter 5 is less than the analog input, the step size will be added to the accumulator value in accumulator 6. Conversely, if the output from the digital to analog converter is greater than the analog input, the voltage comparator will set the latch to a 1 instead of a 0 causing the step size from the step size generator 8 to be subtracted from the accumulator value 6. The step size generator 8 will calculate the desired step size according to some companding algorithm which is not of significance to the present invention and of which there exist a large variety well known to those of skill in the art. What is important is that the step size generation companding algorithm has some minimum step size and that means must be provided for detecting when the minimum step size has been generated.

Figures 2, 3:
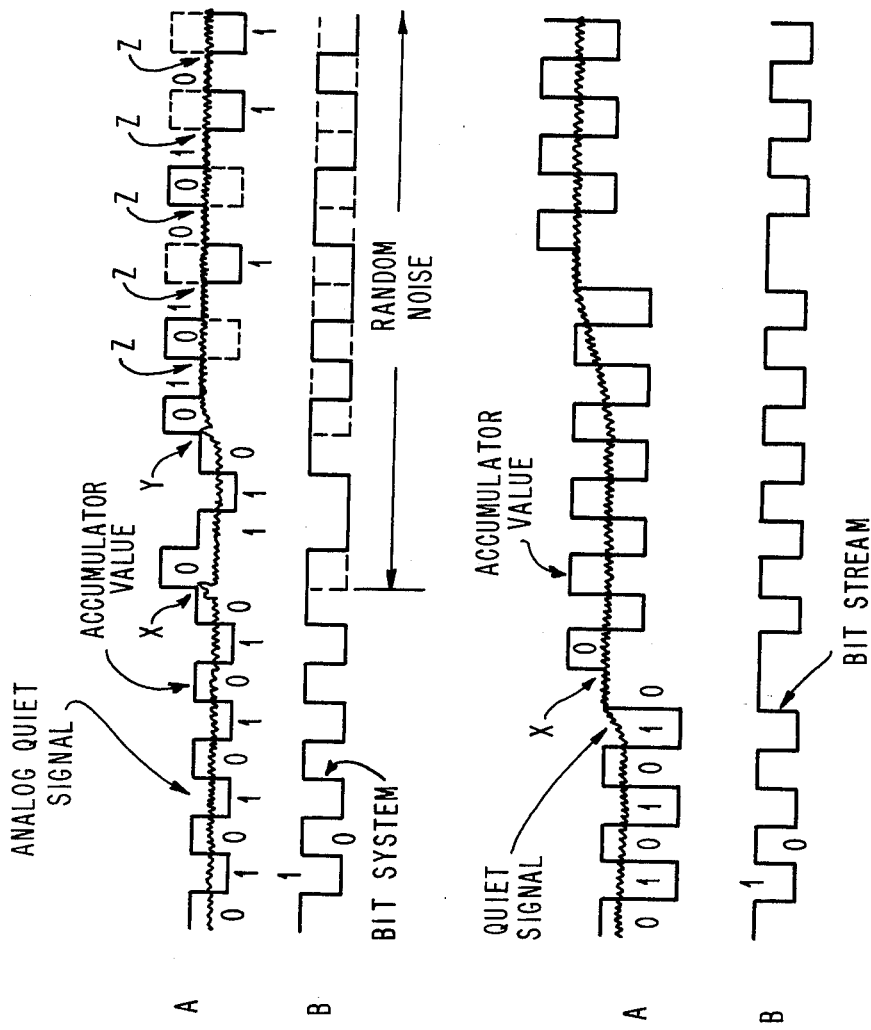
FIG. 2 is a schematic representation of a quiet signal digital bit stream in a delta modulation system and an illustration of how random noise may be generated.
FIG. 3 illustrates the bit stream as an output from a delta modulation system operated under the conditions of the present invention to restore the quiet signal and reduce the random noise generation.
Figure 4:
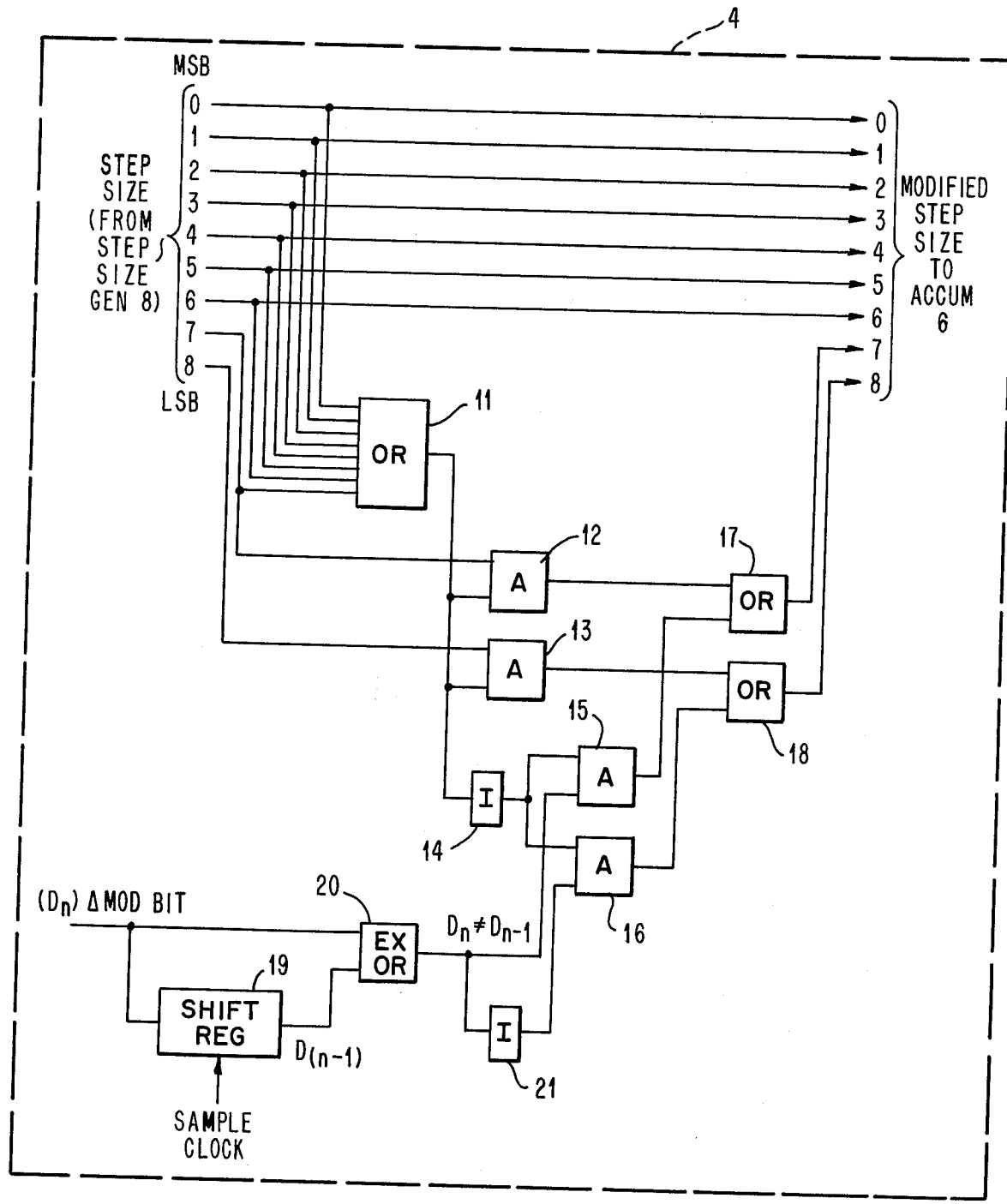
FIG. 4 illustrates a preferred embodiment of a circuit for modifying the step size algorithm in the circuitry of FIG. 1.

The problem which is encountered and which the present invention addresses itself to is illustrated schematically in FIG. 2.

In line A of FIG. 2, the actual input analog signal is illustrated with the accumulator value level superimposed at the sampling frequency as represented by a square wave as shown. It may be seen that when the analog signal value approaches the accumulator value residing in the accumulator, a step will be generated in the plus or minus direction depending upon the difference between the analog signal and the accumulator value. This process is under the control of the step size generator. For example, as illustrated at point X in line A of FIG. 2, the analog signal input reached a value hypothetically equal to the accumulator value at the instant of a given sample. This results in the generation of an additional 0, breaking the 0, 1 alternate pattern for a typical quiet signal, and shifts the accumulator value upward by an amount equal to the minimum step size generated in the step size generator. Those of skill in the art will instantly appreciate that this results (at the output of the demodulator at the other end of a signal transmission system) in a signal which will have an increased amplitude instead of the normal quiet level signal. The frequency components for such random variations are low and are contained in the audio band which will be passed by the low pass filters normally used to filter out the sampling frequency components. This problem may repeat itself at random intervals as illustrated at point Y and may be ambiguous when the accumulator value closely tracks the quiet signal level as shown at point C which can result in a random triggering of an additional step in one direction or the other instead of the alternate 0, 1 type of quiet signal output.

The bit stream generated in the modulator is illustrated in line B of FIG. 2 beneath the representation of line A. It will be seen that the initial quiet signal digital transmission of alternate 1's and 0's is broken at point X and may be broken at points Y, Z, etc., in a random pattern resulting in the generation of unwanted noise components at low levels and within the audio band which will be heard from the demodulator as an output signal in the signal transmission system.

Turning to FIG. 3, the details of a preferred embodiment for the minimum circuit 9 contained in FIG. 1 are shown. The dotted box 4 illustrates the components which are contained within the minimum circuit 9 as shown in FIG. 1. The step size as calculated by the step size generator 8 is received in this minimum circuit 9 in a binary coded 8-bit form in which the 0-bit is deemed the most significant bit and bit 8 the least significant. Bits 0 through 6 are passed directly to the accumulator without modification. However, bits 0 through 7 are ORed together in OR gate 11 so that the output of the OR will be in a 1 state if any of the inputs on lines 0 through 6 are in a 1 state. This will indicate that the step size from the step size generator is greater than the minimum value and that the minimum circuit should not modify the step size sent to the accumulator. This function is accomplished by the output from OR gate 11 which is used to condition AND gates 12 and 13 to pass the bits 7 and 8 through to the OR gates 17 and 18 which in turn pass these bits in an unchanged form to the accumulator. The output from OR gate 11 is inverted in inverter 14 so that the output of it may disable AND gates 15 and 16 under certain conditions just described so that these gates will deliver 0's to the OR gates 17 and 18 and not interfere with the passage of bits 7 and 8.

If only bit 8 from the step size generator is in a 1 condition, then the minimum circuit will be operative to control the step size fed to the accumulator. This condition is detected by OR gate 11 and indicated by its output being in a 0 state. A 0 from OR gate 11 inhibits bits 7 and 8 from passing directly through the AND gates 12 and 13 to the OR gates 17 and 18. At the same time a 0 from OR gate 11 is inverted through inverter 4 to enable the AND gates 15 and 16. This result passes the condition of the output of the Exclusive OR gate 20 through AND gates 15 and OR gate 17 to the output bit 7. At the same time, the Exclusive OR gate output is inverted through inverter 21 and passed through AND gate 16 and OR gate 18 to the output of bit 8. In this condition, the output step size fed to the accumulator will have all 0's in the bit positions 0 through 6 while bit 7 will be the same as the Exclusive OR output from OR gate 20 and bit 8 will be the compliment of this output.

A 1-bit shift register 19 is also shown. At each sample time the last delta modulation output bit is shifted into this register at the same time that the new bit shifts to the output of the sample latch in FIG. 1. The abbreviation $D_n$ is used here to denote the newest delta modulation bit while $D_{n-1}$ (the output of shift register 19) denotes the previous delta modulation bit. During each bit time, $D_n$ and $D_{n-1}$ are Exclusive ORed together in block 20, the output of which controls the values assigned to bits 7 and 8 of the step size which will be fed to the accumulator.

The following truth table shows the value of the output bits 7 and 8 as a function of the delta modulation bits $D_n$ and $D_{n-1}$.

|       |           | Output |       |
|-------|-----------|--------|-------|
| $D_n$ | $D_{n-1}$ | Bit 7  | Bit 8 |
| 0     | 0         | 0      | 1     |
| 0     | 1         | 1      | 0     |
| 1     | 0         | 1      | 0     |
| 1     | 1         | 0      | 1     |

The truth table above shows the value of the output bits 7 and 8 as a function of $D_n$ and $D_{n-1}$ when the input bits 0 through 7 are 0 and the modification circuit just described will be engaged. It will be understood that the output of bits 0 through 6 will be all 0 in such a case. If the input bits 0 through 7 are not all 0, then the output bits 0 through 8 will be the same as those originally inputted and the modification circuit will not be activated.

Turning to FIG. 3, the results of this technique on the typical analog signal input are illustrated in lines A and B. As shown in FIG. 3, line A, whenever the calculated step size is the minimum step size and the new delta modulation bit is not the same as the previous bit, the step size applied to the accumulator will be forced to twice the minimum step size level. The result of this modification is that the step sizes are automatically adjusted so as to straddle the signal level. If the output signal level drifts from this position, the modified algorithm will allow the selected steps to shift so that they will once more straddle the signal and restore the quiet 1 and 0 pattern. In line A the square wave accumulator value signal is shown at twice the minimum step size shown in FIG. 2 and it will be observed that once point X is reached and the accumulator value matches or is less than the analog value, a minimum step size will be generated shifting the output level outward in a typical 0 bit output, thus breaking the sequence of alternating 0's and 1's seen previously. However, at the very next sample time, the double minimum step size is restored and the alternating 0, 1 pattern is re-established. Thus, the accumulator value has been shifted to straddle the quiet signal analog level and eliminate all but the briefest portion of an unwanted noise signal which would otherwise occur as shown in FIG. 2.

It will be apparent to those of skill in the art that numerous specific circuit embodiments could be constructed to do this detecting and modification step for the lowest order bits in the bit stream sent to the accumulator. Of course, the basic method would still be unchanged even though modifications were made to the detection and modification circuitry for altering the low order bits as just described. Therefore, it is desired that the invention as described be not limited to the specific embodiment shown, but protected by Letters Patent by claims as follows:

I claim:

1. In a delta modulation digital signal transmission system having a voltage step size generator operating under a simulation algorithm for controlling the generation of 1 and 0 bits in the transmission system for later demodulation and reconstruction of an analog waveform, the method of reducing random or low level noise production during low level or quiet passages of the analog input signal comprising steps of:

detecting the minimum step size calculation at the output of the step size generator;

comparing the presently modulated digital bit to be transmitted with the previously transmitted digital bit; and when said bits do not compare and said minimum step size has been detected, modifying the calculated step size by forcing the step size for the bit next transmitted to be greater than the minimum step size used in the modulation system.

2. A method as described in claim 1 wherein:

said modified step size is twice the minimum step size used in said modulation system.

* * * * *